United States Patent
Velichko

(10) Patent No.: US 10,313,613 B2
(45) Date of Patent: Jun. 4, 2019

(54) HIGH DYNAMIC RANGE IMAGE SENSORS WITH FLICKER AND FIXED PATTERN NOISE MITIGATION

(71) Applicant: SEMICONDUCTOR COMPONENTS INDUSTRIES, LLC, Phoenix, AZ (US)

(72) Inventor: Sergey Velichko, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/791,626

(22) Filed: Oct. 24, 2017

(65) Prior Publication Data

US 2019/0124278 A1    Apr. 25, 2019

(51) Int. Cl.
| | |
|---|---|
| *G01R 19/00* | (2006.01) |
| *G01R 31/26* | (2014.01) |
| *H04N 5/355* | (2011.01) |
| *H01L 27/146* | (2006.01) |

(52) U.S. Cl.
CPC ..... *H04N 5/35536* (2013.01); *G01R 31/2635* (2013.01); *H01L 27/14609* (2013.01); *H04N 5/35554* (2013.01); *H04N 5/35581* (2013.01); *G01R 19/0084* (2013.01)

(58) Field of Classification Search
CPC ........... H04N 5/35536; H04N 5/35581; H04N 5/35554; H01L 27/14609; G01R 31/2635; G01R 19/0084
See application file for complete search history.

(56) References Cited

U.S. PATENT DOCUMENTS

| | | | |
|---|---|---|---|
| 9,344,647 | B2 | 5/2016 | Agranov et al. |
| 2006/0071254 | A1 | 4/2006 | Rhodes |
| 2007/0045681 | A1* | 3/2007 | Mauritzson ....... H01L 27/14609 |
| | | | 257/292 |

(Continued)

OTHER PUBLICATIONS

M. Sakakibara et. el. "An 83dB-Dynamic-Range Single-Exposure Global-Shutter CMOS Image Sensor with In-Pixel Dual Storage", in ISSCC 2012 Proc., pp. 380-382, Feb. 2012.

(Continued)

*Primary Examiner* — Jason A Flohre
(74) *Attorney, Agent, or Firm* — Treyz Law Group, P.C.; Jason Tsai

(57) ABSTRACT

An image sensor pixel may include a photodiode coupled to a pixel charge storage via a charge transfer transistor, a charge overflow capacitor coupled to the pixel charge storage via a gain control transistor, and an adjustable reset drain that is coupled to the charge overflow capacitor via a reset transistor. The reset transistor may receive a reset signal that is dynamically adjusted during an acquisition phase to help reduce flicker. The potential barrier of the reset transistor may also be calibrated during readout to reduce fixed pattern noise among different pixels. The image sensor pixel may generate an image using a linear combination of at least three signals read out using the charge overflow capacitor and light flickering mitigation operations. The image may be a high dynamic range image that is generated from at least a low exposure signal and a high exposure signal.

20 Claims, 10 Drawing Sheets

(56) References Cited

U.S. PATENT DOCUMENTS

| | | | |
|---|---|---|---|
| 2008/0252762 A1* | 10/2008 | Iwamoto | H04N 5/35518 348/301 |
| 2011/0285403 A1 | 11/2011 | Walschap | |
| 2012/0132787 A1* | 5/2012 | Mabuchi | H04N 5/363 250/208.1 |
| 2013/0107094 A1* | 5/2013 | Yamamoto | H01L 27/1461 348/302 |
| 2013/0222552 A1 | 8/2013 | Agranov et al. | |
| 2015/0062364 A1* | 3/2015 | Nakamura | H04N 5/3559 348/218.1 |
| 2015/0256777 A1* | 9/2015 | Ishii | H04N 5/363 250/208.1 |
| 2015/0279899 A1* | 10/2015 | Kim | H01L 27/1463 250/208.1 |

OTHER PUBLICATIONS

N. Akahane, et al., "Optimum Design of Conversion Gain and Full Well Capacity in CMOS Image Sensor With Lateral Overflow Integration Capacitor," IEEE Trans. Electron Devices, vol. 56, No. 11, pp. 2429-2435, Nov. 2009.

Velichko, U.S. Appl. No. 15/333,407, filed Oct. 25, 2016.

\* cited by examiner

HIGH DYNAMIC RANGE IMAGE SENSORS WITH FLICKER AND FIXED PATTERN NOISE MITIGATION

BACKGROUND

This relates generally to imaging devices, and more particularly, to imaging devices having image sensor pixels with overflow capabilities.

Image sensors are commonly used in electronic devices such as cellular telephones, cameras, and computers to capture images. In a typical arrangement, an image sensor includes an array of image pixels arranged in pixel rows and pixel columns. Circuitry may be coupled to each pixel column for reading out image signals from the image pixels.

Typical image pixels contain a photodiode for generating charge in response to incident light. Image pixels may also include a charge storage region for storing charge that is generated in the photodiode. Image sensors can operate using a global shutter or a rolling shutter scheme. In a global shutter, every pixel in the image sensor may simultaneously capture an image, whereas in a rolling shutter each row of pixels may sequentially capture an image.

Image sensors may be equipped with multi-exposure high dynamic range (HDR) functionality where multiple images are captured with an image sensor at different exposure times. The images are later combined into a high dynamic range image. In conventional HDR image sensors, a long-exposure image may be sampled during a first readout cycle. Memory buffers are then typically used to store the long-exposure image. While the memory buffers store the long-exposure image, a short-exposure image is generated. The short-exposure image is then sampled in a second readout cycle. After the short-exposure image is sampled, the short-exposure image and the long-exposure image are combined to form an HDR image. However, memory buffers may add additional costs to manufacturing the image sensor (e.g., increased Silicon cost). Additionally, standard HDR image sensor pixels may have other deficiencies such as unwanted saturation of the photodiode caused by bright scenes and inability to detect flickering light.

It is within this context that the embodiments herein arise.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
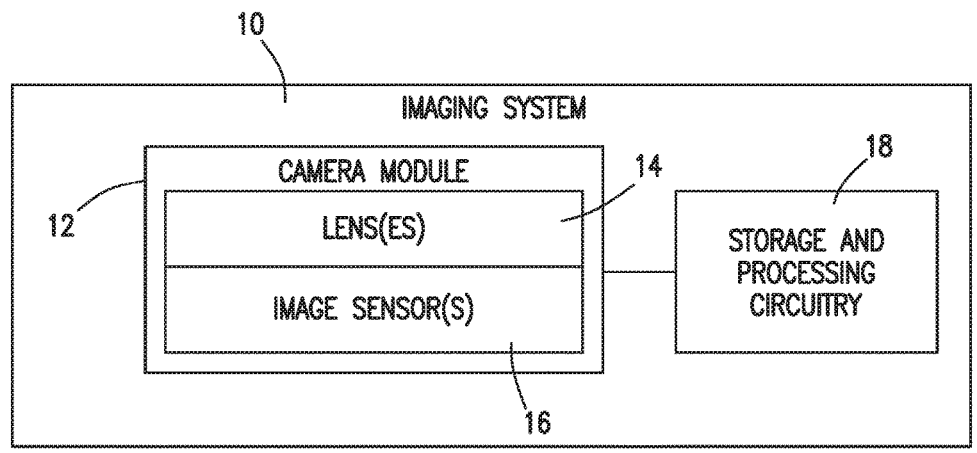
FIG. 1 is a diagram of an illustrative electronic device having an image sensor and processing circuitry for capturing images using an array of image pixels in accordance with an embodiment.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from the camera module and/or that form part of the camera module (e.g., circuits that form part of an integrated circuit that includes image sensors 16 or an integrated circuit within the module that is associated with image sensors 16). When storage and processing circuitry 18 is included on different integrated circuits (e.g., chips) than those of image sensors 16, the integrated circuits with circuitry 18 may be vertically stacked or packaged with respect to the integrated circuits with image sensors 16. Image data that has been captured by the camera module may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2:
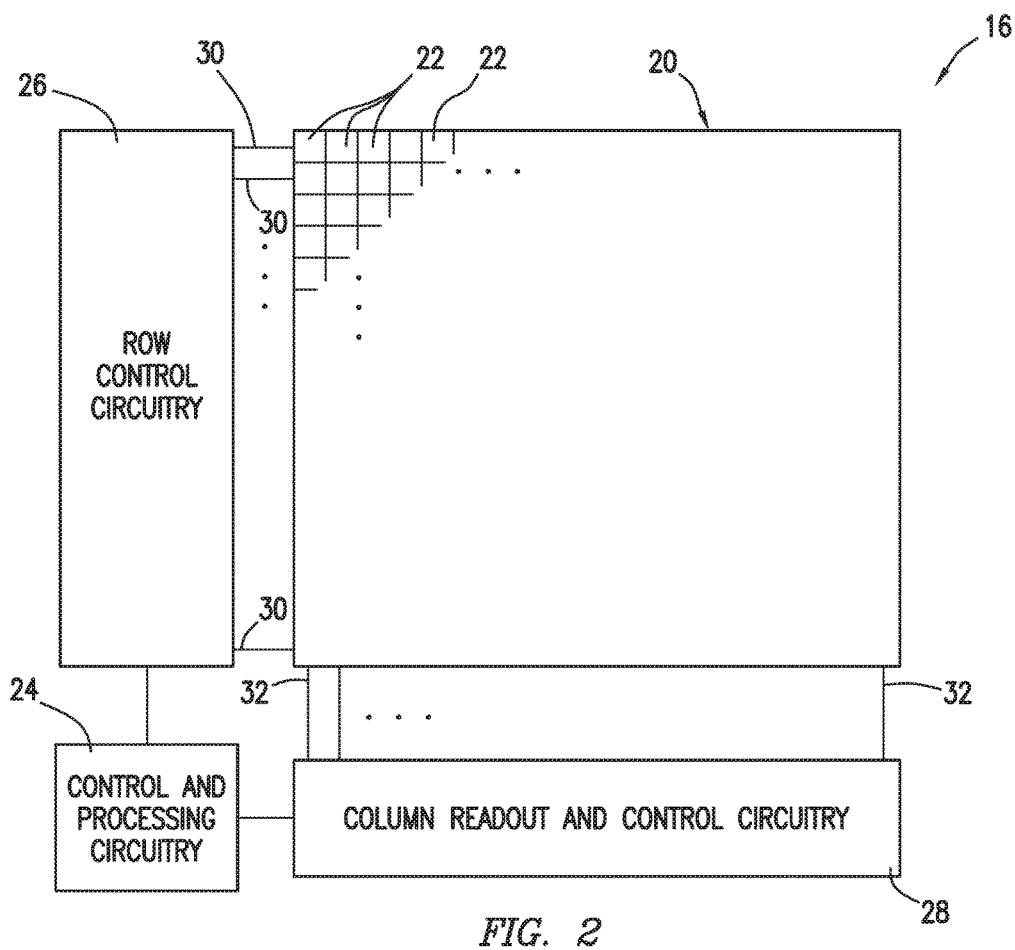
FIG. 2 is a diagram of an illustrative pixel array and associated readout circuitry for reading out image signals from the pixel array in accordance with an embodiment.

FIG. 2 shows how image sensor 16 may include one or more arrays 20 of image pixels 22. Image pixels 22 may be formed in a semiconductor substrate using complementary metal-oxide-semiconductor (CMOS) technology or charge-coupled device (CCD) technology or any other suitable photosensitive devices technology. Image pixels 22 may be frontside illumination (FSI) image pixels or backside illumination (BSI) image pixels. A given image sensor pixel (e.g., an image pixel within image pixels 22, sometimes referred to herein simply as image pixel 22) may include one or more photosensitive regions. For example, image pixel 22 may include one photosensitive region or a pair of photosensitive regions (e.g., a pair of split photodiodes) or more that two photosensitive regions. A microlens (e.g., a portion of lens 14) may be formed over image pixel 22.

As shown in FIG. 2, image sensor 16 may include a pixel array 20 containing image sensor pixels 22 arranged in rows and columns (sometimes referred to herein as image pixels or pixels) and control and processing circuitry 24. Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) for pixels in one or more pixel columns.

Figure 3:
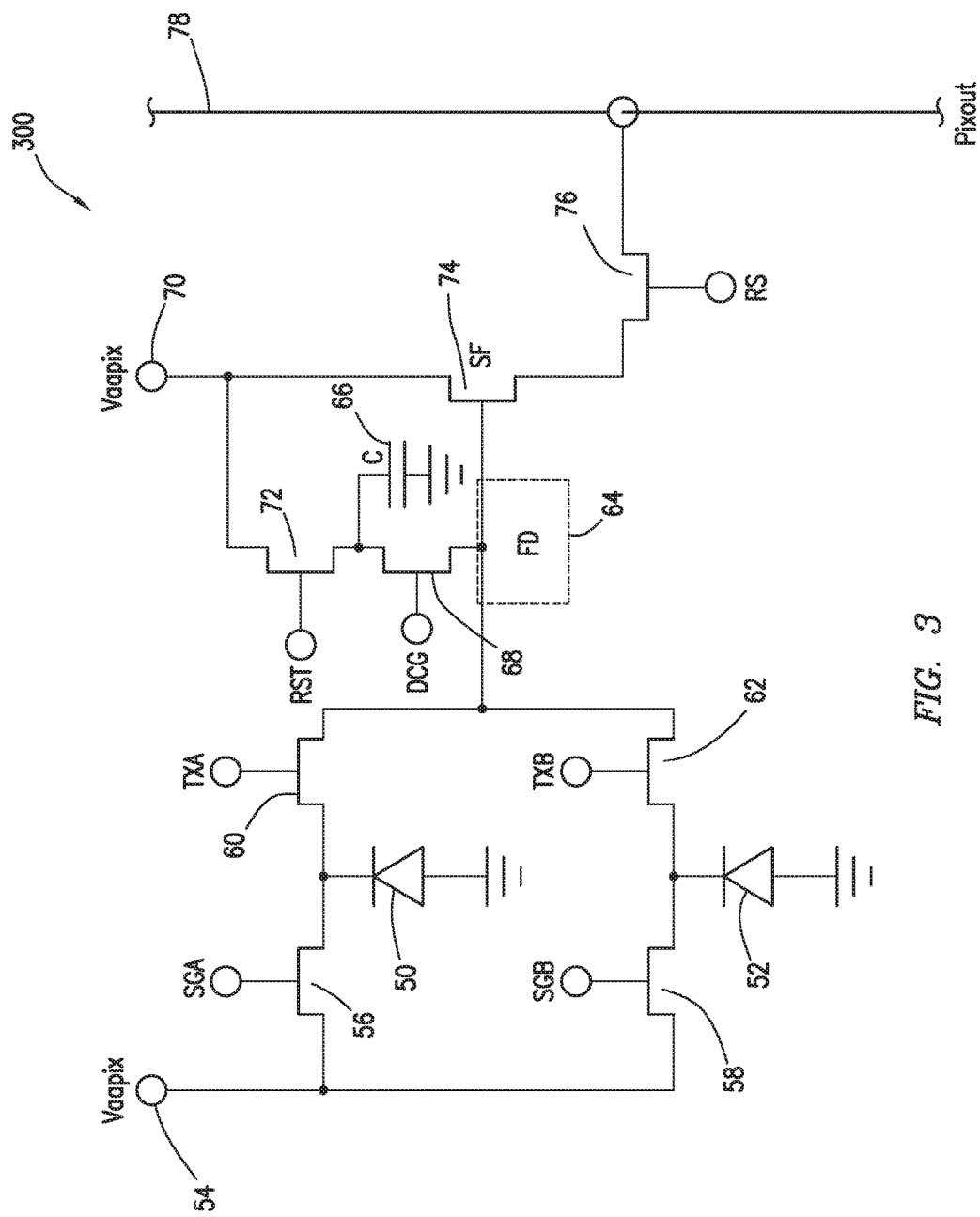
FIG. 3 is a circuit diagram of an illustrative image sensor pixel with a pair of split photodiodes in accordance with an embodiment.

FIG. 3 is a circuit diagram of an illustrative image sensor pixel such as pixel 300. Pixel 300 may include photosensitive regions 50 and 52 (e.g., split photodiodes 50 and 52, or simply, photodiodes 50 and 52). Photosensitive regions 50 and 52 may be covered by a single microlens or, if desired, may be covered by separate microlens(es). If desired, photodiodes 50 and 52 may be pinned elements (e.g., elements pinned to a predetermined potential, voltage level, or pinned potential). Photodiodes 50 and 52 may receive incident light over a period of time (i.e., exposure time) and generate an image signal corresponding to the incident light over the exposure time.

In conventional imaging systems, image artifacts may be caused by moving objects, moving or shaking camera, flickering lighting, and objects with changing illumination in an image frame. Such artifacts may include, for example, missing parts of an object, edge color artifacts, and object distortion. Examples of objects with changing illumination include light-emitting diode (LED) traffic signs (which can flicker several hundred times per second) and LED brake lights or headlights of modern cars. Image signals generated with a short integration time and a short exposure time may miss the flickering light (e.g., the blinking light of the LED at a given frequency). However, by spreading the short integration time over a longer exposure time, there is less chance to miss the signal from the flickering light (e.g., pulse light source, LED).

Pixel 300 may be designed to reduce artifacts associated with flickering lighting by spreading a short integration time over a longer exposure time. To implement flicker mitigation, photodiodes 50 and 52 may be coupled to voltage source 54 with supply voltage Vaapix through respective shutter gate transistors 56 and 58. When respective control signal SGA and SGB are asserted (e.g., pulsed high), photodiodes 50 and 52 may be respectively reset. When control signal SGA and SGB are deasserted (e.g., pulsed low), photodiodes 50 and 52 may begin to accumulate charge from incident light.

Pixel 300 may include transfer transistors 60 and 62, and pixel charge storage 64 (e.g., pixel charge storage structure 64, floating diffusion region 64, pinned storage diode 64, storage gate 64, etc.). Transfer transistors 60 and 62 may each include a source terminal, a drain terminal, a gate terminal, and a channel region. Floating diffusion region 64 may be a doped-semiconductor region (e.g., a doped silicon region formed in a silicon substrate by ion implantation, impurity diffusion, or other doping techniques) that has charge storage capabilities (e.g., has a capacitance). If desired, floating diffusion region 64 may be a floating diffusion node.

Photodiode 50 may be connected to a first terminal (e.g., a source or drain terminal) of transistor 60. Floating diffusion region 64 may be connected to a second terminal that opposes the first terminal of transistor 60. As an example, if the first terminal is the source terminal, the second terminal may be the drain terminal, or vice versa. Control signal TXA may control a flow of charge across the channel of transistor 60. When control signal TXA is asserted, the image charge stored in photodiode 50 may pass through the channel region of transistor 60 to floating diffusion region 64. Control signal TXA may be subsequently deasserted and photodiode 50 may be reset using control signal SGA. Similarly, photodiode 52 may be coupled to floating diffusion region 64 via transfer transistor 62. Control signal TXB may similarly control a flow of charge across transfer transistor 62.

To improve the charge storage capacity of pixel 300 (e.g., to extend the charge storage capabilities of floating diffusion region 64), overflow capacitor 66 having a capacitance C may be coupled to floating diffusion region 64 via gain control transistor 68. Capacitance C may be much larger than the capacitance associated with floating diffusion region 64, for example. Control signal DCG may control transistor 68 to enable or disable the extension of charge storage capacity of floating diffusion region 64 by respectively asserting or deasserting control signal DCG. Floating diffusion region 64 may also be coupled to voltage source 70 supplying voltage level Vaapix. If desired, voltage source 70 may be the same voltage source as voltage source 54. Alternatively, if desired, voltage source 70 may provide a different voltage level than voltage level Vaapix. Floating diffusion region 64 may be coupled to voltage source 70 via reset transistor 72 and gain control transistor 68. Overflow capacitor 66 and floating diffusion region 64 may be collectively reset to a voltage level (e.g., a voltage level close to Vaapix) by asserting control signals RST and DCG.

Pixel 300 may also include readout circuitry which includes source follower transistor 74 and row select transistor 76. Transistor 76 may have a gate that is controlled by row select control signal RS. When control signal RS is asserted, transistor 76 is turned on and a corresponding signal Pixout (e.g., an output signal having a magnitude that is proportional to the amount of charge at floating diffusion node 64) is passed onto column readout path 78 (sometimes referred to herein as bus line 78 and corresponding to lines 32 in FIG. 2). Conversion of incident light into corresponding image signals at photodiode 50 may occur simultaneously with image signal readout, if desired.

Figure 4:
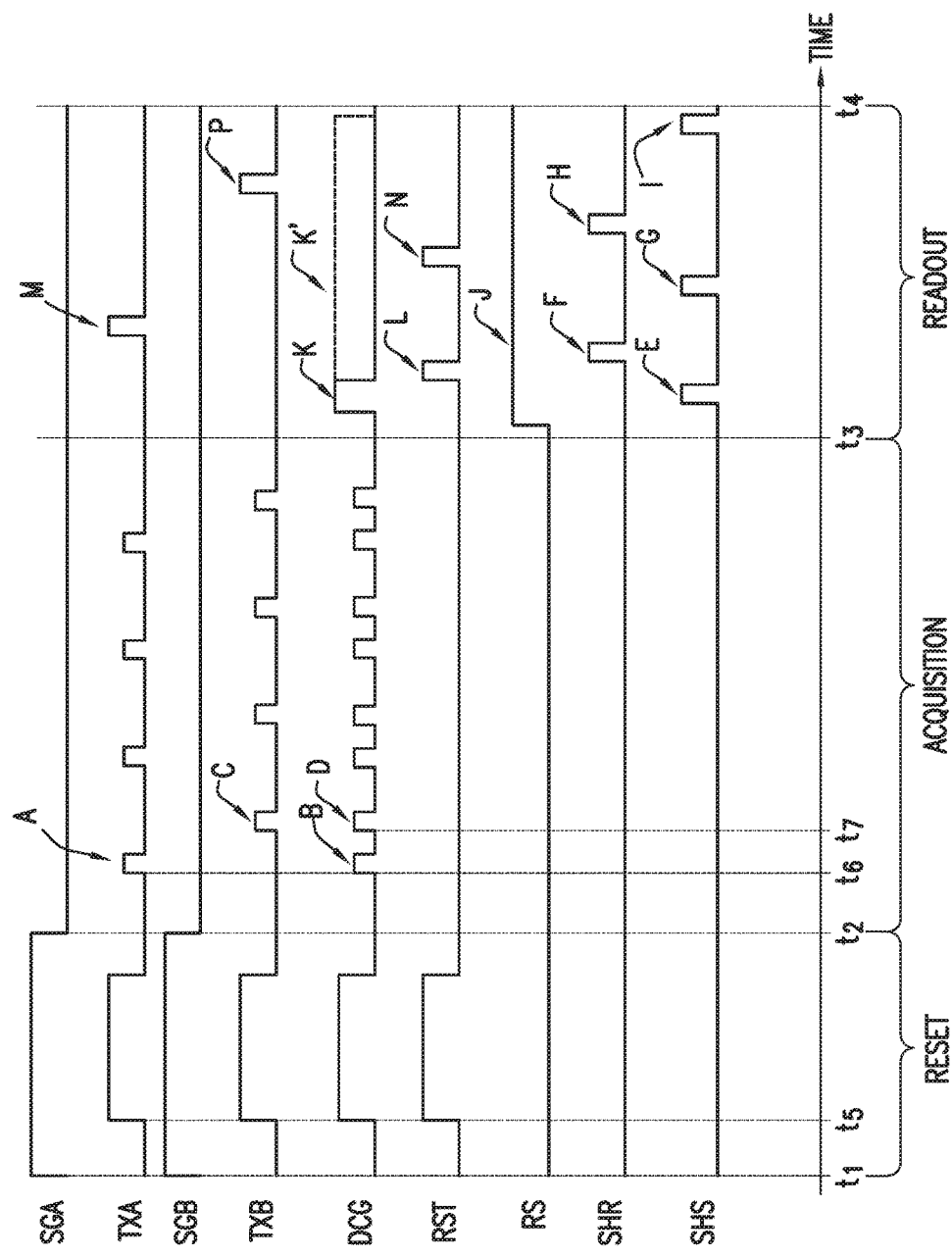
FIG. 4 is a timing diagram for operating the illustrative image sensor pixel shown in FIG. 3 to enable the pair of split photodiodes to have charge overflow capabilities in accordance with an embodiment.

Pixel 300 as shown in FIG. 3 may operate in a charge overflow mode (e.g., operate with an enabled overflow capacitor) to store excess charge that floating diffusion region 64 cannot store (e.g., would normally oversaturate floating diffusion region 64). FIG. 4 shows a timing diagram of operating pixel 300 in a charge overflow mode of operation.

Between times t1 and t2, a pixel reset period may occur, in which charge storage regions within pixel 300 may be reset close to a supply voltage level (e.g., voltage level Vaapix). During the pixel reset period, transistors 60, 62, 68, and 72 may be simultaneously enabled by asserting respective control signals TXA, TXB, DCG, and RST to reset split photodiodes 50 and 52, floating diffusion region 64, and capacitor 66 (e.g., at time t5). Control signals TXA, TXB, DCG, and RST may be deasserted prior to or at time t2, which starts an acquisition period for pixel 300. Transistors 56 and 58 may be similarly enabled during the pixel reset period (e.g., at time t1) by asserting respective control signals SGA and SGB to reset photodiodes 50 and 52. Transistors 56 and 58 may be deasserted to disconnect photodiodes 50 from voltage source 54 and allow photodiodes 50 and 52 to begin storing charge corresponding to incident light (e.g., at time t2), thus beginning a pixel acquisition period (e.g., a signal acquisition period).

During pixel acquisition period, beginning at time t2 and ending at time t3, incident light may be converted into charge at photodiodes 50 and 52. The converted charge may be stored at (e.g., split amongst) different charge storage regions within pixel 300 (e.g., photodiodes 50 and 52, floating diffusion region 64, and capacitor 66). At time t6, assertions A and B may enable transfer transistor 60 and gain control transistor 68, respectively. By using assertions A and B (sometimes referred to herein collectively as an overflow transfer assertion), some or all of the charge accumulated at photodiode 50 from time t2 to time of the falling edge of assertion A may move into floating diffusion region 64 and overflow capacitor 66. The amount of accumulated charge may be determined by the potential difference between a source-drain terminal of transistor 60 that is connected to photodiode 50 and a source-drain terminal of transistor 60 connected to the floating diffusions region 64 and capacitor 66 combination. Overflow transfer assertions that synchronize a transfer assertion and a gain control assertion will reduce gate dark current contributions (e.g., by using overflow capacitor 66). It may be desirable to realize (e.g., provide) a potential under gain control transistor that is higher than the pinned potential of photodiodes 50 and 52 as pinned elements. Additionally, it may be desirable to realize a large enough potential difference (e.g., 2V, 2.5V, etc.) between the terminals transfer transistors to optimize performance in transferring part or all charge from photodiodes to floating diffusion regions, for example.

Similarly, at time t7, assertions C and D may enable transfer transistor 62 and gain control transistor 68, respectively. By using assertions C and D (e.g., another overflow transfer assertion), some or all of the charge accumulated at photodiode 52 from time t2 to time of the falling edge of assertion C may transfer into floating diffusion region 64 and overflow capacitor 66. The amount of accumulated charge to be transferred may be determined similarly to the process in connection with transistor 60. The transferred charge accumulated at photodiode 52 may be combined with the accumulated charge previously moved using assertions A and B. Additionally, if one or both of photodiodes 50 and 52 accumulate charge above a threshold barrier (e.g., a threshold potential barrier), the accumulated charge above the threshold barrier may overflow into floating diffusion region 64 and optionally capacitor 66 by enabling transistor 68.

Additional assertions of transfer transistors 60 and 62, and gain control transistor 68 (e.g., additional overflow transfer assertions) similar to assertions of A, B, C, and D may take place during the pixel acquisition period. The additional assertions may be further increase the amount of charge stored at the floating diffusion region 64 and capacitor 66. The advantage of operating pixel 300 in charge overflow mode is associated with assertions B, D, and similar additional assertions of control signal DCG. Control signal DCG, which essentially provides floating diffusion region 64 with access to overflow capacitor 66, which may have a substantially larger capacitance (e.g., a capacitance ten times larger, more than ten times larger, with any suitable larger capacitance, etc.) than does diffusion region 64. Overflow capacitor 66 may be a metal-insulator-metal (MiM) capacitor that is outside of an active area of pixel 300 (e.g., outside of the gate layer of pixel 300), for example. As such, overflow capacitor 66 may not consume valuable pixel area (e.g., photosensitive element area).

Pixel 300 may operate with any suitable number of additional overflow transfer assertions associated with charges stored at photodiodes 50 and 52 during the signal acquisition period. Each overflow transfer assertion may increase the amount of charge stored at the floating diffusion region 64 and capacitor 66 combination (e.g., may be combined with the charge transferred by all previous overflow transfer assertions).

After performing a suitable number of overflow transfer assertions, the signal acquisition period may end at time t3. At time t3, photodiodes 50 and 52 may store leftover charge that has not moved (or cannot be moved because of a potential barrier) to floating diffusion region 64 and capacitor 66. At time t3, floating diffusion region 64 and overflow capacitor 66 may store a large amount of charge associated with the sum of charge moved by all the overflow assertions during the signal acquisition period.

Time t3 may begin a pixel readout period (e.g., a row readout period) that may start with assertion J, which enables row select transistor 76. Assertion J may begin at the beginning of the pixel readout period and end at the end of the pixel readout period. During the readout period, the charge stored at floating diffusion region 64 and overflow capacitor 66 may be read out first. Then, the charge stored at photodiodes 50 and 52 may be read out one after the other, in any suitable order.

As an example, during the readout period, following assertion J, control signal DCG may be asserted (e.g., assertion K) to collecting both charge stored at overflow capacitor 66 and charge stored at floating diffusion region 64 for readout. In particular, as soon as row select control signal is asserted, charge stored at floating diffusion region 64 may be read out via source follower transistor 74 and carried off pixel 300 via line 78 (as signal Pixout). After assertion K, charge stored at capacitor 66 may first flow to floating diffusion and collectively read out with the charge previously stored at floating diffusion region 64. The collected charge may be sampled and held as a first image signal (e.g., using assertion E).

After all the stored charge from the floating diffusion region 64 and capacitor 66 combination have been read out, control signal RST may be asserted (e.g., using assertion L) to reset overflow capacitor 66. If desired, during this time, floating diffusion region 64 may also be reset by further extending assertion K as shown by assertion K'. The reset state of floating diffusion region 64 may be read out as a first reset signal (e.g., sampled and held as shown by assertion F). Using the first reset signal, the first image signal may be read out using a 3T operation (e.g., using a correlated readout during which the reset readout occurs following the signal readout), in which the first image signal level may be compared to the first reset signal level to remove any errors (e.g., offset errors, systematic noise).

After floating diffusion 64 and capacitor 66 have been reset, charge stored at photodiode 50 may be moved to floating diffusion region 64 via assertion M of control signal TXA. The charge stored at photodiode 50 and moved to floating diffusion region 64 may include any charge accumulated during acquisition between t2 and t3 and modulated by transistor 60 gate potential during this phase. Optionally, if the charge moved to floating diffusion region 64 may oversaturate floating diffusion 64 (e.g., is larger than the well-capacity of floating diffusion 64), control signal DCG may be asserted through extended assertion K'. The charge transferred to floating diffusion 64 (and optionally, capacitor 66) may be read out (as a second image signal) together with the first reset signal readout in a correlated double sampling (CDS) readout. A CDS readout may compare an image signal with a reset signal readout directly before the image signal to eliminate any systematic as well as random noise (e.g., reset noise). As shown by assertion G, the second signal may be sampled and held as part of the CDS readout.

Charge stored at photodiode 52 may be read out in a similar manner as the second signal readout. In particular, assertion N and K' may reset floating diffusion 64 and capacitor 66. The reset state of the floating diffusion region may be read out as a second reset signal readout (e.g., using assertion H). The charge stored at photodiode 52 may then be moved to floating diffusion region 64 and optionally capacitor 66 via assertion P and optionally extended assertion K'. Similarly, the charge stored at photodiode 52 and moved to floating diffusion region 64 may include any charge accumulated during acquisition between t2 and t3 and modulated by transistor 62 gate potential during this phase. During assertion I, the charge from photodiode 52 may be sampled and held as a third image signal. In combination with the second reset signal, the third image signal may be read out as a CDS readout. It may be desirable for the second and third image signals to be read out in a CDS readout because the amount of charge during readout may be very small (e.g., may be susceptible to random noise). Row select control signal may finally be deasserted to end the readout period of pixel 300.

An overall pixel signal may be generated using a linear combination of all of the image signals. For example, the first, second, and third image signals may be combined to generate an overall image. By using overflow capacitor 66, the dynamic range of pixel 300 may be substantially increased, thereby increasing visibility especially relating to dark scenes in an image. In practice, however, variations in the threshold voltage of transistors 56, 58, 60, and 62 among different pixels 300 in the pixel array can result in a fixed pattern noise that may not be acceptable, such as for automotive imaging applications (as an example).

Figure 5:
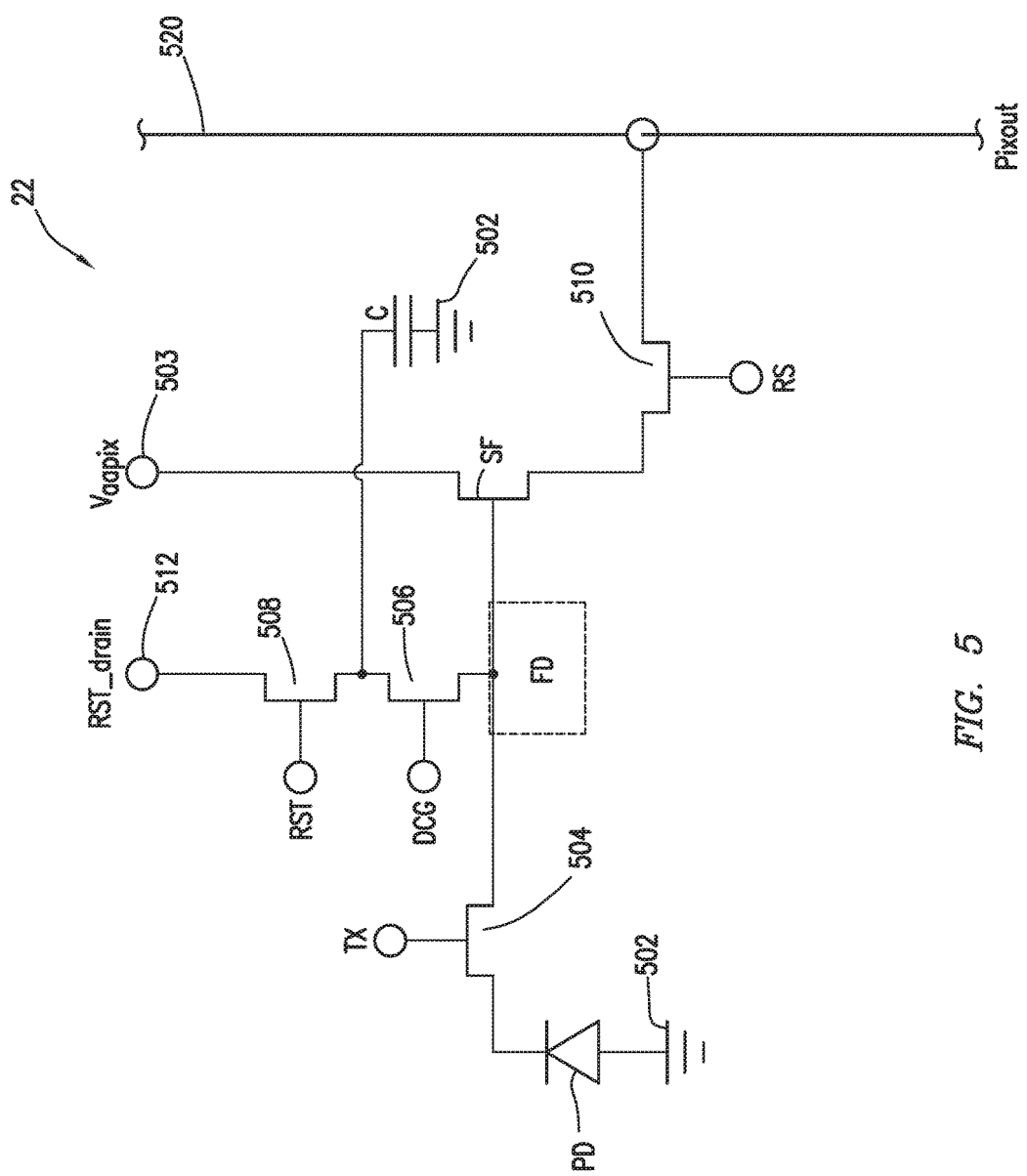
FIG. 5 is a circuit diagram of an illustrative image sensor pixel that is configured to support dynamic reset gate potential barrier modulation in accordance with an embodiment.

In accordance with an embodiment, pixel 22 is provided that is configured to support dynamic reset gate potential barrier modulation, which mitigates flicker and motion artifacts (see, e.g., FIG. 5). Pixel 22 is also configured to support self-calibration of the reset gate potential barrier level, which helps reduce fixed pattern noise. As shown in FIG. 5, pixel 22 may include a photosensitive element such as photodiode PD, a charge transfer transistor 504, a gain control transistor 506, a reset transistor 508, a storage capacitor C, a source follower transistor SF, and a row select transistor 510. Photodiode PD may have a p-type terminal coupled to ground line 502 (e.g., a ground power supply terminal on which ground power supply voltage is provided) and a n-type terminal that is coupled to floating diffusion region FD via transistor 504. Transistor 504 may have a gate terminal that receives charge transfer control signal TX, which is asserted (e.g., driven high) to transfer accumulated charge from photodiode PD to region FD. Floating diffusion region FD may sometimes be referred to as the floating diffusion node or a pixel charge storage node.

Transistor SF may include a gate terminal coupled to region FD, a drain terminal coupled to power supply terminal 503 (e.g., a power supply terminal on which positive power supply voltage Vaapix is provided), and a source terminal that is coupled to a corresponding column output line 520 via row select transistor 510. Transistor 510 may have a gate terminal that receives row select control signal RS, which is asserted (e.g., driven high) to drive output voltage Pixout at line 520, where Pixout is proportional to the total amount of charge as seen from the gate of transistor SF.

Gain control transistor 506 may be coupled between floating diffusion region FD and capacitor C. Capacitor C may have a first capacitor terminal coupled to transistor 506 and a second capacitor terminal coupled to ground line 502. Transistor 506 may have a gate terminal that receives gain control signal DCG, which can be selectively asserted (e.g., driven high) to couple region FD to capacitor C. When signal DCG is high, pixel 22 may be placed in a low conversion gain (LCG) mode and the total amount of storage capacity at floating diffusion region FD may be extended by the additional storage capacity of capacitor C. When signal DCG is low, pixel 22 may be placed in a high conversion gain (HCG) mode, and floating diffusion region FD may be decoupled from capacitor C.

Reset transistor 508 may be coupled between a reset drain terminal 512 and transistor 506. Reset drain terminal 512 may be separate and different than power supply terminal 503 and is configured to receive reset drain voltage RST_drain, which is an adjustable voltage signal that can be selectively controlled to reset capacitor C and/or floating diffusion region FD to the desired potential level. Transistor 508 may have a gate terminal that receives reset control signal RST to selectively couple the reset drain voltage RST_drain to capacitor C and optionally to floating diffusion region FD if signal DCG also happens to be asserted.

Figure 6:
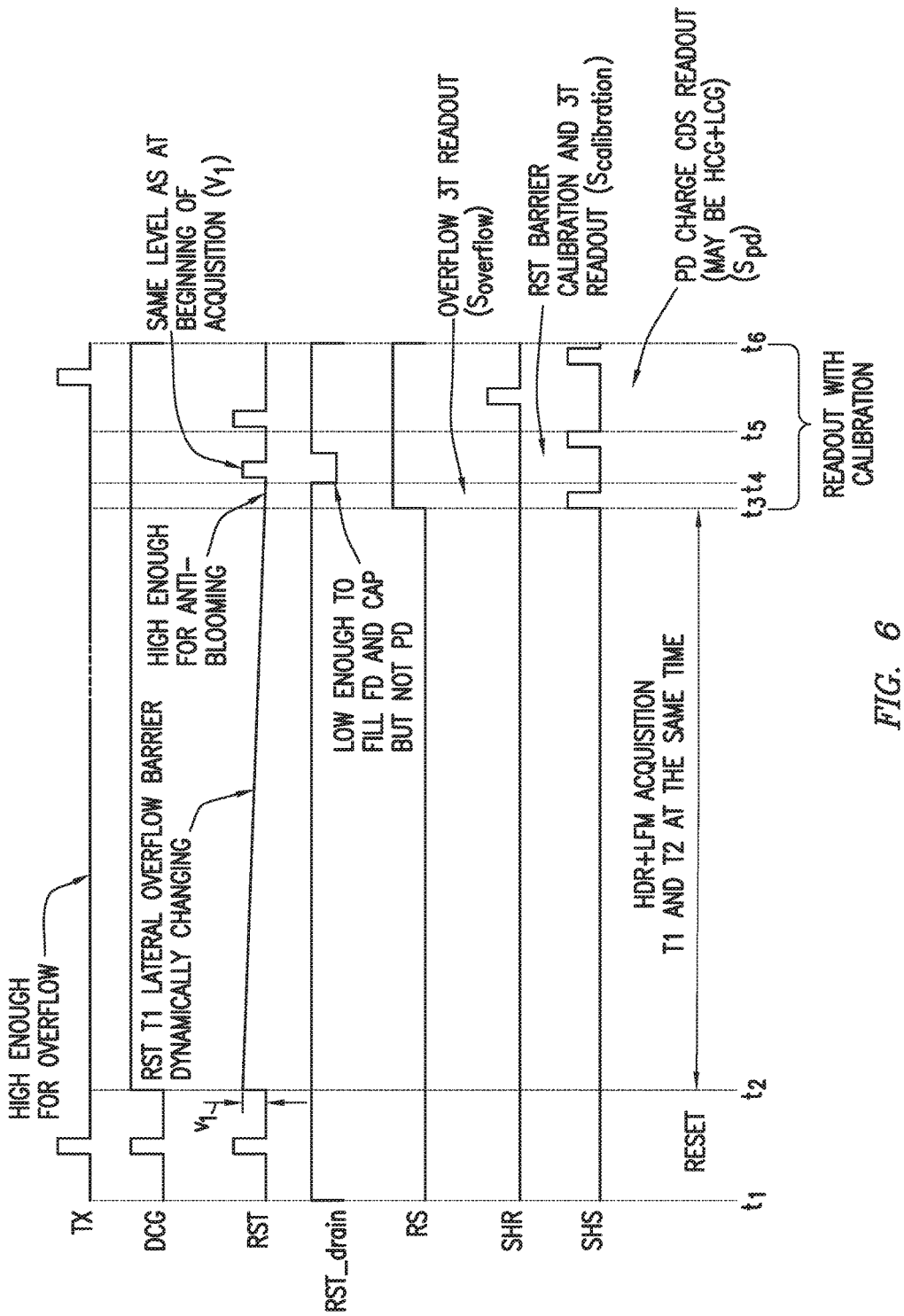
FIG. 6 is a timing diagram illustrating how the reset gate potential barrier can be a monotonically decreased over time in accordance with an embodiment.

FIG. 6 is a timing diagram illustrating one suitable way for operating pixel 22 of FIG. 5. Initially, reset drain voltage RST_drain is driven high (e.g., to Vaapix) while all other control signals such as TX, DCG, RST, and RS are low. Voltage Vaapix may be equal to 2.8 V (as an example), although other suitable power supply voltage levels may be used if desired. Signal SHR represents a sample-hold-reset operation during which a reset signal level is read out from pixel 22, whereas signal SHS represents a sample-hold-signal operation during which an image signal level is read out from pixel 22.

Figure 7A:
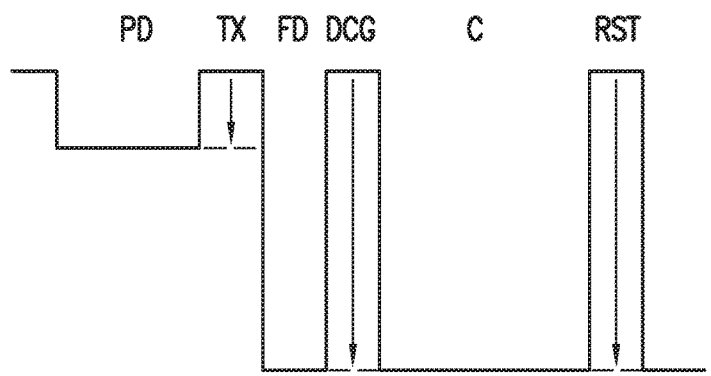
FIGS. 7A-7C are charge potential diagrams illustrating the flow of accumulated charge during various phases of pixel operation shown in FIG. 6 in accordance with some embodiments.

During a reset phase (e.g., from time t1 to t2), signals TX, DCG, and RST may be simultaneously pulsed high to reset the potential of photodiode PD, floating diffusion region FD, and storage capacitor C. In other words, all charge (or electrons) will be drained from PD, FD, and C out to the reset drain terminal 512. FIG. 7A is a charge potential diagram showing the state of regions PD, FD, and C during the reset phase. As shown in FIG. 7A, all charge is removed from these regions.

Referring back to FIG. 6, signal DCG is driven high and signal RST is driven to a predetermined intermediate voltage level V1 at time t2, which starts the acquisition period. Voltage level V1 may be less than the voltage level of Vaapix. For example, voltage level V1 may be equal to 1.5 V, 1.8 V, 2.0 V, 1.0 V, 1.2 V, or some other intermediate voltage level between Vaapix and 0 V. During the acquisition phase from time t2 to t3, signal DCG remains high, so floating diffusion region FD and capacitor region C are connected, which collectively serves as a larger combined storage region (see, e.g., FIG. 7B). In other words, the floating diffusion region and the capacitor storage region may be combined during the acquisition phase to serve as a combined FD+C storage region.

Figure 7B:
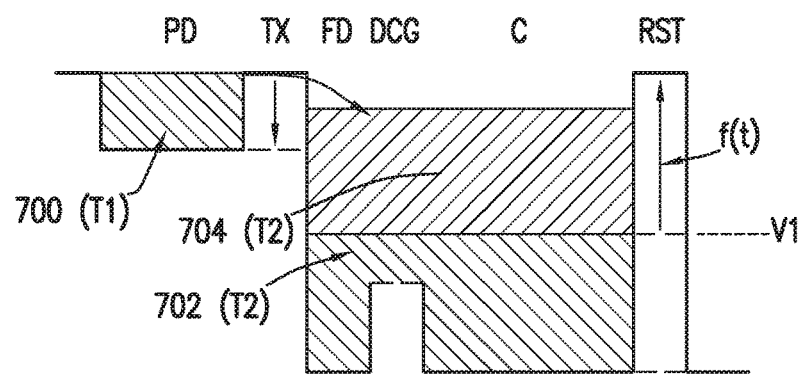

As shown in FIG. 7B, photodiode region PD can only hold so much charge. It is assumed that the current light level is high enough such that accumulated charge overflows from the photodiode region PD into the combined FD+C region even when signal TX is low. As shown in FIGS. 6 and 7B, signal RST is monotonically adjusted over time (e.g., signal RST is constantly decreasing throughout the acquisition period, dropping from V1 towards 0 V). This is shown in FIG. 7B, where the reset barrier potential goes up as a function of time f(t), starting at potential level V1 at time t2. Function f(t) is shown as a linear function, but may in general by any monotonically decreasing function. Configured in this way, the amount of charge 700 in photodiode PD and the amount of charge 702 in the combined FD+C region represents the total amount of charge associated with exposure time T1, whereas the amount of charge 704 above voltage level V1 represents the total amount of charge associated with exposure time T2. Operated in this way, charge 700 serves to represent low light signals, charge 702 serves to represent mid light signals, and charge 704 serves to represent high light signals.

Note that charge 702 and 704 are accumulated in the same combined FD+C region. Thus, exposure times T1 and T2 are done at the same time (e.g., times T1 and T2 at least partially overlap). The speed and duration of f(t) can also be adjusted to control the light sensitivity. Performing exposure times T1 and T2 in parallel during an extended acquisition period allows flicker to be captured, which reduces flicker and undesired motion artifacts. Arranged in this way, the use of the combined FD+C region increases the dynamic range of pixel 22, while performing T1 and T2 at the same time helps with light flicker mitigation (LFM).

At time t3, row select control signal RS may be asserted to prepare pixel 22 for readout. At this time, a first SHS signal ($SHS_1$) may be captured using a 3T operation (e.g., using a correlated readout during which the reset readout occurs following the signal readout). The first SHS signal may represent a combined overflow signal $S_{overflow}$, which is proportional to the sum of charge 702 and 704 in FIG. 7B.

Figure 7C:
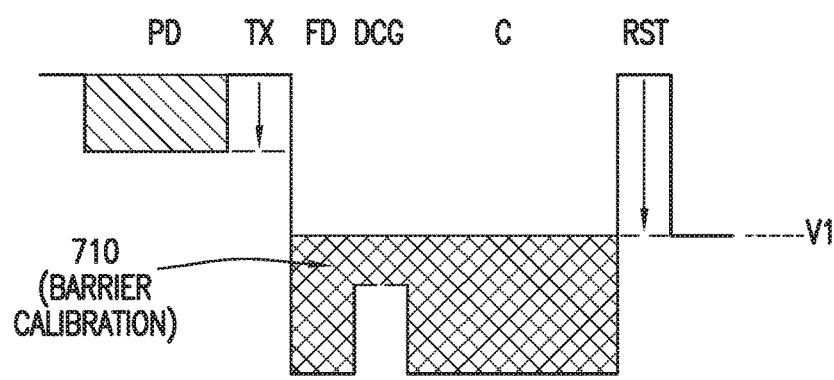

At time t4, reset signal RST is pulsed high to level V1 (which is the same voltage level at the beginning of the acquisition period), and reset drain voltage RST_drain may be pulsed low enough to fill the combined FD+C region up to voltage level V1 without filling photodiode region PD. The state of pixel 22 during this time is illustrated in FIG. 7C. As shown in FIG. 7C, reset signal RST is lowered to level V1, which allows RST_drain to fill in charge 710 in the combined FD+C region. Charge 710 may be used to calibrate the potential barrier of the reset gate (e.g., the reset transistor may be at least partially activated to fill the floating diffusion region and the capacitor storage region with a predetermined amount of charge 710 to calibrate a potential barrier of the reset transistor).

Prior to time t5, voltage RST_drain may be raised high and a second SHS signal ($SHS_2$) may be captured using another 3T operation. The second SHS signal may represent a calibration signal $S_{calibration}$, which is proportional to the amount of charge 710 as shown in FIG. 7C. The amount of charge 710 effectively measures and calibrates the potential barrier of the reset gate at voltage level V1.

From time t5 to t6, the amount of charge in photodiode PD may be read out via correlated double sampling (CDS). At time t5, signal RST may be pulsed high to reset/drain all charge from the combined FD+C region. Thereafter, a reset signal SHR may be captured, followed by capture of a third SHS signal ($SHS_3$). The third SHS signal may represent a photodiode signal $S_{pd}$, which is proportional to the amount of charge 700 as shown in FIG. 7B. Configured in this way, $S_{overflow}$ may be compared with $S_{calibration}$ to compute the amount of charge 704 associated with T2 (e.g., by subtracting $S_{calibration}$ from $S_{overflow}$). The third phase from time t3 to t6 may therefore sometimes be referred to as the readout and calibration phase. Performing calibration of the reset gate potential eliminates any source of variation among pixels across the array and therefore helps mitigate fixed pattern noise.

The example of FIG. 6 shows how signal DCG is continuously asserted even during readout (e.g., thereby placing pixel 22 in LCG mode). This is merely illustrative. If desired, DCG may also be selectively pulsed low during readout when operating in HCG mode.

Figure 8:
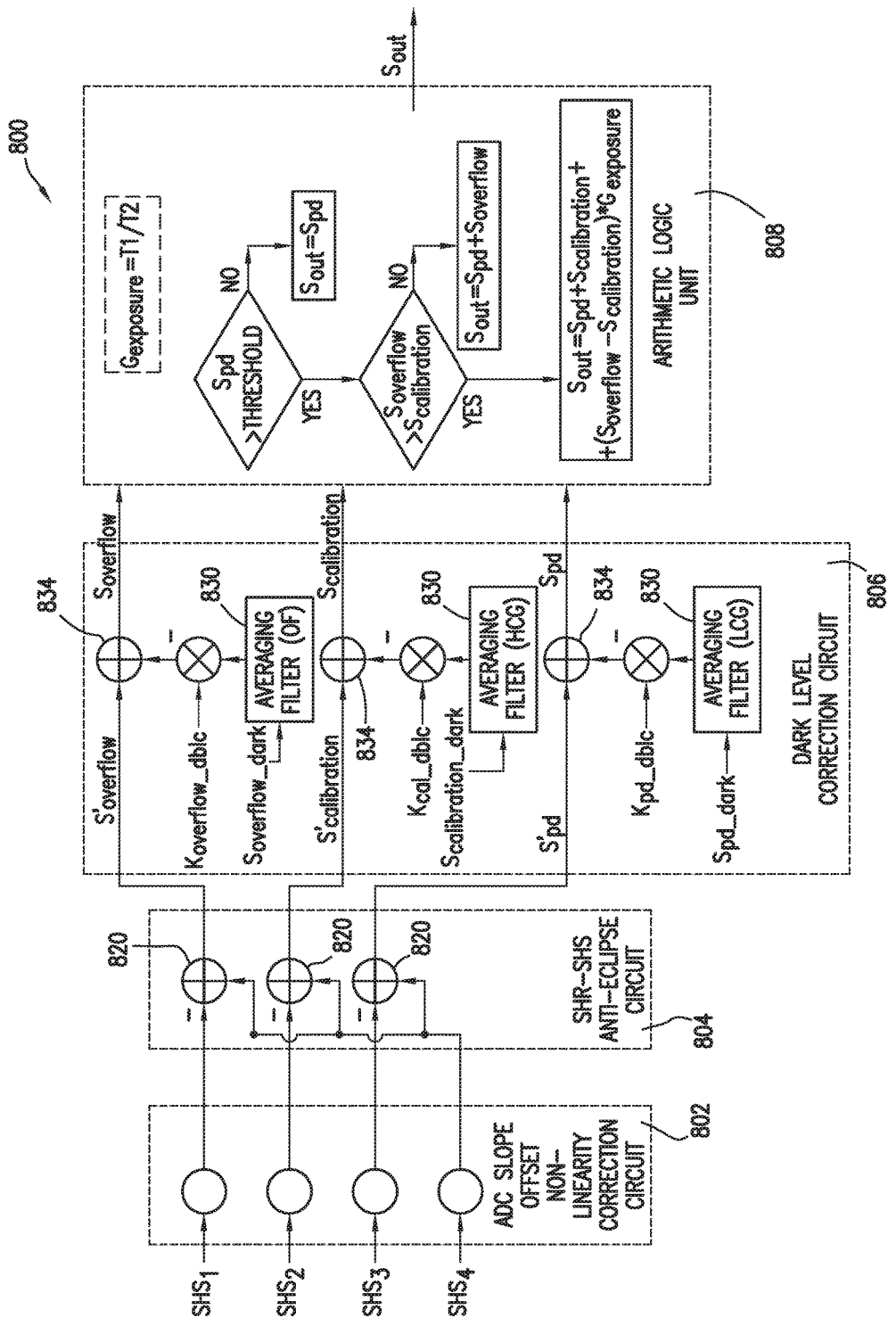
FIG. 8 is a diagram of readout circuitry that is configured to compute an output signal in accordance with an embodiment.

FIG. 8 is a diagram of illustrative readout circuitry 800 that receives the readout signals from pixel 22, performs any necessary reset gate potential barrier calibration, and generates a corresponding calibrated output signal. Circuitry 800 may, for example, be part of column readout and control circuitry 28 or control and processing circuitry 24 in FIG. 1.

As shown in FIG. 8, readout circuitry 800 may include a correction circuit such as analog-to-digital (ADC) slope offset and non-linearity correction circuit 802, an anti-eclipse circuit such as SHR-SHS anti-eclipse circuit 804, a dark level correction circuit 806, and an arithmetic logic unit (ALU) 808. Circuit 802 may receive signals $SHS_1$, $SHS_2$, $SHS_3$, and SHR captured during the readout and calibration phase and may output corresponding corrected versions to circuit 804. Circuit 804 may subtract the SHR signal from each of the SHS signals to output signals $S'_{overflow}$, $S'_{calibration}$, and $S'_{pd}$, respectively, to dark level correction circuit 806.

Dark level correction circuit 806 uses dark pixels with same signals from pixel 22 as an active pixel. Dark pixel signals for overflow (i.e., $S_{overflow\_dark}$), photodiode (i.e., $S_{pd\_dark}$), and calibration (i.e., $S_{calibration\_dark}$) are all different and need different schemes for correction. For instance, the three dark pixel values (e.g., $S_{overflow\_dark}$, $S_{calibration\_dark}$, $S_{pd\_dark}$) may be averaged over the dark pixel region and additionally filtered using circuits 830 (e.g., by removing the biggest and smallest values in the region) over multi-frames and subtracted with corresponding dark black level correction (DBLC) coefficients $K_{overflow\_dblc}$, $K_{cal\_dblc}$, $K_{pd\_dblc}$ from corresponding active pixel values using circuits 834. Coefficients $K_{overflow\_dblc}$, $K_{cal\_dblc}$, $K_{pd\_dblc}$ may range from less than 1 if dark pixels has corresponding dark currents greater than active pixels (due to impact of layout, metal shield, surrounding electronics, etc.), close to 1 if they are somewhat similar, or greater than 1 if dark pixel currents are smaller than that of active pixels. Additionally this may be done per color plane (e.g., using different coefficients and filter queue per color plane). This can also be done per readout gain (e.g., using different coefficients and filter queue per color plane and per readout gain). Circuit 806 may generate corrected signals $S_{overflow}$, $S_{calibration}$, and $S_{pd}$ to arithmetic logic unit 808.

Logic unit 808 may generate final output signal $S_{out}$ using the decision tree illustrated in FIG. 8. First, signal $S_{pd}$ may be compared to a predetermined threshold. The predetermined threshold is a preselected level that is used to determine whether $S_{pd}$ is in the linear region. In other words, it may be used to determine when it would be necessary to sum charge 700 and charge 702 (see, e.g., FIG. 7B, to determine when the photodiode starts to overflow into the combined FD+C region). This threshold should be less than the maximum possible level of $S_{pd}$. If $S_{pd}$ is not greater than the predetermined threshold (e.g., if no overflow is detected), then signal $S_{out}$ is set equal to $S_{pd}$.

If $S_{pd}$ is greater than the predetermined threshold (e.g., if overflow is detected), then logic unit 808 will compare $S_{overflow}$ with $S_{calibration}$. If $S_{overflow}$ is not greater than $S_{calibration}$ (e.g., if the sum of charge 702 and 704 in FIG. 7B is less than the amount of charge 710 in FIG. 7C), then signal $S_{out}$ is set equal to the sum of $S_{pd}$ and $S_{overflow}$. No calibration is necessary in this case since the amount of overflow charge does not even exceed the calibration level V1.

If $S_{overflow}$ is greater than $S_{calibration}$ (e.g., if the sum of charge 702 and 704 in FIG. 7B exceeds the amount of charge 710 in FIG. 7C), then signal $S_{out}$ is set equal to the sum of $S_{pd}$, $S_{calibration}$, and the product of $(S_{overflow}-S_{calibration})$ multiplied by $G_{exposure}$. Gain $G_{exposure}$ may be defined as the ratio of T1 to T2 (e.g., $G_{exposure}=T1/T2$). By computing the difference between $S_{overflow}$ and $S_{calibration}$, the amount of charge 704 can be calculated, the result of which can be scaled by $G_{exposure}$ and added to $S_{pd}$ and $S_{calibration}$ to arrive at the final output value. The ratio of T1 to T2 ($G_{exposure}$) is determined by a monotonically decreasing function f(t) of RST gate potential changing during exposure. In case of simple discrete V1 and V2 levels, $G_{exposure}$ is a simple T1/T2 ratio, where T1 is time of exposure for RST gate at level V1 and T2 is time of exposure for RST gate at level V2. In cases of more complex RST gate exposure potential function f(t), $G_{exposure}$ may be determined experimentally using bench measurements.

Figure 9:
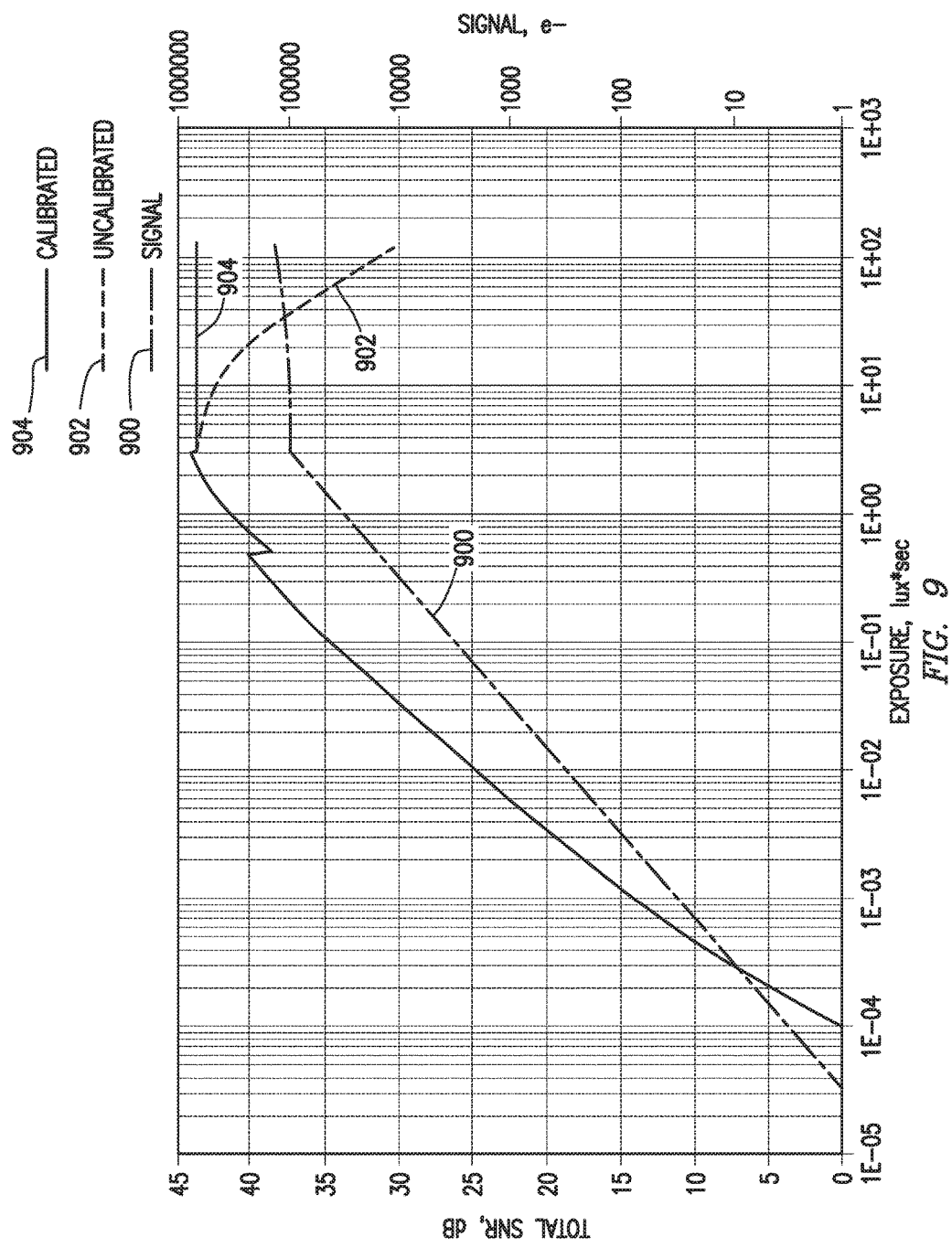
FIG. 9 is a plot illustrating how self-calibration of the reset gate potential barrier removes fixed pattern noise and improves signal-to-noise ratio in accordance with an embodiment.

FIG. 9 is a plot illustrating how self-calibration of the reset gate potential barrier removes fixed pattern noise and improves signal-to-noise ratio (SNR). Curve 900 represents the signal level (referring to the y-axis on the right) as a function of exposure level. Curve 902 represents the total SNR without calibration (referring the y-axis on the left), whereas curve 904 represents the total SNR with calibration. As shown in FIG. 9, uncalibrated readout scenario suffers from degraded SNR at high exposure levels, whereas the calibrated readout scenario exhibits close to ideal SNR performance at high exposure levels. Thus, in addition to reduced fixed pattern noise, SNR is greatly improved by performing calibration of the reset gate potential barrier.

Figure 10:
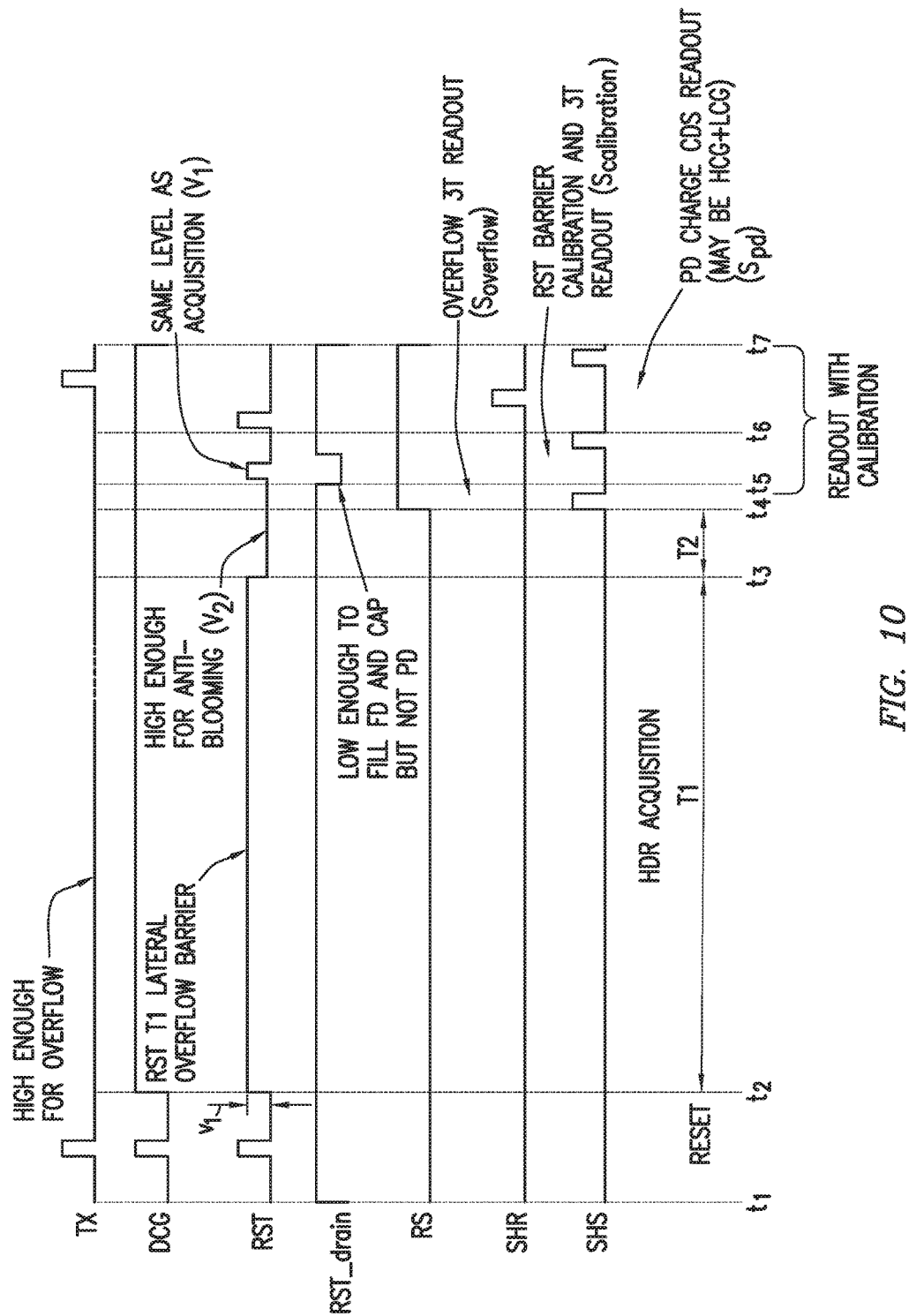
FIG. 10 is a timing diagram illustrating how the reset gate potential barrier can have two discrete expose phases in accordance with an embodiment.

FIG. 10 shows another suitable embodiment illustrating how the reset gate potential barrier can have two discrete expose phases (e.g., reset control signal is separated into a first discrete period associated with only exposure time T1 and a second discrete period associated with only exposure time T2). Initially, reset drain voltage RST_drain is driven high (e.g., to Vaapix) while all other control signals such as TX, DCG, RST, and RS are low. During a reset phase (e.g., from time t1 to t2), signals TX, DCG, and RST may be simultaneously pulsed high to reset the potential of photodiode PD, floating diffusion region FD, and storage capacitor C. In other words, all charge (or electrons) will be drained from PD, FD, and C out to the reset drain terminal 512.

At time t2, signal DCG is driven high and signal RST is driven to a predetermined intermediate voltage level V1, which starts the acquisition period. Voltage level V1 may be less than the voltage level of Vaapix. For example, voltage level V1 may be equal to 1.5 V, 1.8 V, 2.0 V, 1.0 V, 1.2 V, or some other intermediate voltage level between Vaapix and 0 V. During the acquisition phase from time t2 to t3, signal DCG remains high, so floating diffusion region FD and capacitor region C are connected, which collectively serves as a larger combined storage region (see, e.g., FIG. 11A). In contrast to the operation described in connection with FIGS. 6-7, signal RST remains fixed at voltage level V1 during the entirety of the T1 exposure period.

Figure 11A:
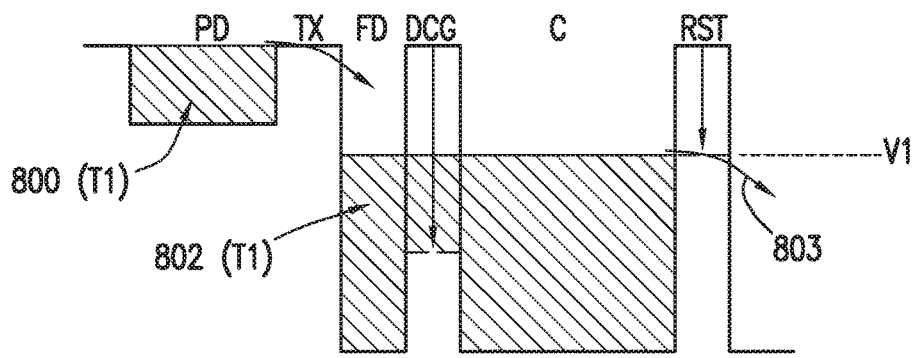
FIGS. 11A-11C are charge potential diagrams illustrating the flow of accumulated charge during various phases of pixel operation shown in FIG. 10 in accordance with some embodiments.

FIG. 11A shows the charge potential diagram for pixel 22 during the T1 acquisition period. As shown in FIG. 11A, photodiode region PD can only hold so much charge (e.g., charge 800). It is assumed that the current light level is high enough such that accumulated charge overflows from the photodiode region PD into the combined FD+C region even when signal TX is low. Since signal RST is fixed at voltage V1, any charge that exceeds the V1 potential barrier level will overflow into the reset drain, as indicated by arrow 803. In other words, charge 802 represents the maximum amount of charge that can be stored in the combined FD+C region during the T1 acquisition period.

Figure 11B:
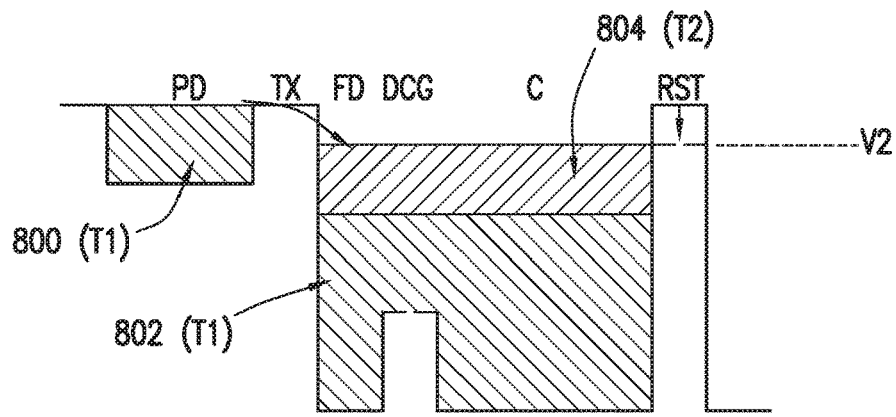

At time t3, signal RST may be lowered to another predetermined intermediate voltage level V2 to begin the T2 exposure period, which may last from t3 to t4. In general, voltage V2 may be greater than the ground voltage and less than V1 (i.e., 0<V2<V1). In the example where V1 is equal to 1.5 V, voltage V2 may be equal to 0.2 V, 0.3 V, 0.4 V, or some other suitable voltage level. FIG. 11B illustrates the charge potential diagram for pixel 22 during this T2 acquisition period. As shown in FIG. 11B, the reset potential barrier is adjusted to voltage level V2, which allows additional charge 804 to accumulate in the combined FD+C region during the T2 acquisition period. Operated in this way, charge 800 serves to represent low light signals, charge 802 serves to represent mid light signals, and charge 804 serves to represent high light signals.

Arranged in this way, the use of the combined FD+C region increases the dynamic range of pixel 22 while accumulating charge 802 in the combined FD+C region during extended period T1 also helps to mitigate flicker.

At time t4, row select control signal RS may be asserted to prepare pixel 22 for readout. At this time, a first SHS signal ($SHS_1$) may be captured using a 3T operation (e.g., using a correlated readout during which the reset readout occurs following the signal readout). The first SHS signal may represent a combined overflow signal $S_{overflow}$, which is proportional to the sum of charge 802 and 804 in FIG. 11B.

Figure 11C:
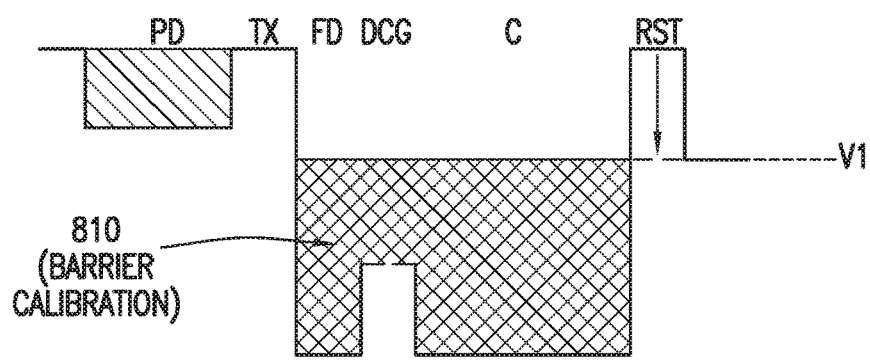

At time t5, reset signal RST is pulsed high to level V1 (which is the same voltage level at the beginning of the acquisition period), and reset drain voltage RST_drain may be pulsed low enough to fill/drain the combined FD+C region up to voltage level V1 without filling photodiode region PD. The state of pixel 22 during this time is illustrated in FIG. 11C. As shown in FIG. 11C, reset barrier RST is lowered to level V1, which allows RST_drain to fill in charge 810 in the combined FD+C region. Charge 810 may be used to calibrate the potential barrier of the reset gate (e.g., the reset transistor may be at least partially activated to fill the floating diffusion region and the capacitor storage region with a predetermined amount of charge 810 to calibrate a potential barrier of the reset transistor).

Prior to time t6, voltage RST_drain may be raised high and a second SHS signal ($SHS_2$) may be captured using another 3T operation. The second SHS signal may represent a calibration signal $S_{calibration}$, which is proportional to the amount of charge 810 as shown in FIG. 11C. The amount of charge 810 effectively measures and calibrates the potential barrier of the reset gate at voltage level V1.

From time t6 to t7, the amount of charge in photodiode PD may be read out via correlated double sampling (CDS). At time t6, signal RST may be pulsed high to reset/drain all charge from the combined FD+C region. Thereafter, a reset signal SHR may be captured, followed by capture of a third SHS signal ($SHS_3$). The third SHS signal may represent a photodiode signal $S_{pd}$, which is proportional to the amount of charge 800 as shown in FIG. 11C. Configured in this way, $S_{overflow}$ may be compared with $S_{calibration}$ to compute to amount of charge 804 associated with T2 (e.g., by subtracting $S_{calibration}$ from $S_{overflow}$). The third phase from time t4 to t7 may therefore sometimes be referred to as the readout and calibration phase. Performing calibration of the reset gate potential eliminates any source of variation among pixels across the array and therefore helps mitigate fixed pattern noise.

The example of FIG. 10 shows how signal DCG is continuously asserted even during readout (e.g., thereby placing pixel 22 in LCG mode). This is merely illustrative. If desired, DCG may also be selectively pulsed low during readout when operating in HCG mode.

The SHS and SHR signals captured using the readout scheme of FIGS. 10 and 11 may be processed using readout circuitry of the type described in connection with FIG. 8. Operated in this way, high dynamic range signals with reduced flicker and reduced fixed pattern noise may be achieved.

The embodiments of FIGS. 5-11 in which the reset signal can be dynamically adjusted, the reset potential barrier can be calibrated, and the low-mid level light can be stored in a combined FD+C region are merely illustrative. If desired, the reset signal may be any type of time-varying signal that is adjusted during acquisition to help reduce flicker and motion artifacts. If desired, the potential barrier of other transistors within pixel 22 may be calibrated during readout. Moreover, additional capacitors or storage regions may be utilized to store overflow charge in pixel 22 to help increase storage capacity to help improve signal-to-noise ratio. Moreover, different types of pixel charge storage may be used instead of diffusion region such as pinned storage diode to help improve signal-to-noise ratio.

The foregoing is merely illustrative of the principles of this invention and various modifications can be made by those skilled in the art without departing from the scope and spirit of the invention.

What is claimed is:

1. An image sensor pixel, comprising:
   a photosensitive element;
   a pixel charge storage node coupled to the photosensitive element;
   a charge transfer transistor coupled between the photosensitive element and the pixel charge storage node; and
   a reset transistor coupled to the pixel charge storage node, wherein the reset transistor is configured to receive a dynamically changing reset control signal during an acquisition phase to mitigate flicker, wherein the reset transistor is further configured to receive a reset drain voltage, and wherein the reset drain voltage is pulsed during a readout phase to calibrate a potential barrier of the reset transistor.

2. The image sensor pixel of claim 1, wherein the dynamically changing reset control signal is monotonically decreasing during the acquisition phase.

3. The image sensor pixel of claim 1, further comprising:
   a power supply line configured to supply a power supply voltage to the image sensor pixel, wherein the reset control signal exhibits an intermediate voltage that is less than the power supply voltage at the beginning of the acquisition phase.

4. The image sensor pixel of claim 3, wherein the reset control signal is pulsed high to the intermediate voltage during the readout phase to calibrate the potential barrier of the reset transistor.

5. The image sensor pixel of claim 1, further comprising:
   a power supply line configured to supply a power supply voltage to the image sensor pixel, wherein the reset control signal exhibits a first intermediate voltage that is less than the power supply voltage during a first period of the acquisition phase and exhibits a second intermediate voltage that is less than the first intermediate voltage during a second period of the acquisition phase.

6. The image sensor pixel of claim 1, further comprising:
   a gain control transistor coupled between the pixel charge storage node and the reset transistor; and
   a capacitor directly coupled to both the gain control transistor and the reset transistor.

7. The image sensor pixel of claim 6, wherein the gain control transistor is turned on during the entirety of the acquisition phase.

8. The image sensor pixel of claim 6, further comprising:
   readout circuitry configured to capture an overflow signal, a calibration signal, and a photodiode signal proportional to an amount of charge stored in the photosensitive element.

9. The image sensor pixel of claim 8, wherein the readout circuitry is further configured to compare the photodiode signal to a predetermined threshold and to compare the overflow signal with the calibration signal.

10. A method of operating an image sensor pixel that includes a photosensitive element, pixel charge storage node, a capacitor storage region, and a reset transistor, the method comprising:

with the photosensitive element, accumulating charge during an acquisition phase;

coupling the pixel charge storage node to the capacitor storage region during the acquisition phase; and partially activating the reset transistor to fill the pixel charge storage node and the capacitor storage region with a predetermined amount of charge to calibrate a potential barrier of the reset transistor, wherein calibration of the potential barrier of the reset transistor mitigates fixed pattern noise.

11. The method of claim 10, further comprising:

supplying a power supply voltage to the image sensor pixel to power the image sensor pixel, wherein partially activating the reset transistor comprises supplying an intermediate voltage that is less than the power supply voltage to a gate terminal of the reset transistor to calibrate the potential barrier of the reset transistor.

12. The method of claim 10, further comprising:

supplying an adjustable reset drain voltage to a drain terminal of the reset transistor to calibrate the potential barrier of the reset transistor.

13. The method of claim 11, further comprising:

supplying the intermediate voltage to the gate terminal of the reset transistor at the beginning of the acquisition period.

14. The method of claim 13, further comprising:

monotonically decreasing the voltage at the gate terminal of the reset transistor throughout the acquisition period to mitigate flicker.

15. An image sensor, comprising:

an image sensor pixel that comprises:
 a photosensitive element;
 a pixel charge storage node coupled to the photosensitive element via a charge transfer transistor;
 a capacitor storage region coupled to the pixel charge storage node via a gain control transistor; and
 a reset transistor coupled to the pixel charge storage node, wherein the reset transistor is configured to receive a dynamically changing reset control signal during an acquisition phase, and wherein the charge transfer transistor remains off during the acquisition phase while the reset control signal is dynamically changing; and readout circuitry configured to receive an overflow signal from the image sensor pixel, wherein the overflow signal represents a total amount of charge that is stored in the pixel charge storage and the capacitor storage region at the end of the acquisition phase.

16. The image sensor of claim 15, wherein the readout circuitry is further configured to receive a calibration signal from the image sensor pixel, and wherein the calibration signal represents an amount of charge that is stored in the pixel charge storage and the capacitor storage region during calibration of a potential barrier of the reset transistor.

17. The image sensor of claim 16, wherein the readout circuitry is further configured to receive a photodiode signal from the image sensor pixel, and wherein the photodiode signal represents an amount of charge that is stored in the photosensitive element.

18. The image sensor of claim 17, wherein the readout circuitry is further configured to compare the photodiode signal to a predetermined threshold and to compare the overflow signal to the calibration signal.

19. The image sensor of claim 17, wherein the readout circuitry is further configured to compute a difference between the overflow signal and the calibration signal and to multiply the computed difference by a predetermined gain.

20. The image sensor of claim 15, wherein the reset control signal dynamically decreases according to a linear function during the acquisition phase.

* * * * *